United States Patent
Zhao et al.

(10) Patent No.: US 7,799,632 B2
(45) Date of Patent: Sep. 21, 2010

(54) METHOD OF FORMING AN ISOLATION STRUCTURE BY PERFORMING MULTIPLE HIGH-DENSITY PLASMA DEPOSITIONS

(75) Inventors: Jin Zhao, Plano, TX (US); Manuel Quevedo-Lopez, Plano, TX (US); Louis H. Breaux, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 511 days.

(21) Appl. No.: 11/654,329

(22) Filed: Jan. 17, 2007

(65) Prior Publication Data

US 2008/0157264 A1    Jul. 3, 2008

Related U.S. Application Data

(60) Provisional application No. 60/877,303, filed on Dec. 27, 2006.

(51) Int. Cl.
*H01L 21/8242* (2006.01)

(52) U.S. Cl. .................. 438/248; 438/391; 438/485; 438/788; 438/792; 257/E21.545

(58) Field of Classification Search ............... 438/248, 438/391, 485, 788, 792; 257/E21.545
See application file for complete search history.

(56) References Cited

U.S. PATENT DOCUMENTS

| 6,426,272 | B1 | 7/2002 | Fu et al. | |
| 6,924,542 | B2 * | 8/2005 | Ji et al. | 257/501 |
| 7,045,410 | B2 | 5/2006 | Mehrad et al. | |
| 2007/0111543 | A1 * | 5/2007 | Woo et al. | 438/783 |

* cited by examiner

*Primary Examiner*—Thanh V Pham
(74) *Attorney, Agent, or Firm*—Jacqueline J. Garner; Wade J. Brady, III; Frederick J. Telecky, Jr.

(57) ABSTRACT

One embodiment of the present invention relates to a method of forming an isolation structure. During this method, an isolation trench is formed within a semiconductor body. After this trench is formed, it is filled by performing multiple high-frequency plasma depositions to deposit multiple dielectric layers over the semiconductor body. A first of the multiple layers is deposited at a high-frequency power of between approximately 100 watts and approximately 900 watts.

12 Claims, 6 Drawing Sheets

METHOD OF FORMING AN ISOLATION STRUCTURE BY PERFORMING MULTIPLE HIGH-DENSITY PLASMA DEPOSITIONS

REFERENCE TO RELATED APPLICATIONS

This application claims priority to Ser. No. 60/877,303 filed Dec. 27, 2006, which is entitled "Shallow Trench Isolation Devices and Methods."

FIELD OF INVENTION

The present invention relates generally to semiconductor devices and more particularly to methods for forming shallow trench isolation structures in the manufacture of semiconductor devices.

BACKGROUND OF THE INVENTION

In the fabrication of semiconductor devices, isolation structures are formed between active areas in which electrical devices such as transistors, memory cells, or the like, are to be formed. The isolation structures, in this case shallow trench isolation (STI) structures, are typically formed during initial processing of a semiconductor substrate, prior to the formation of such electrical devices.

STI isolation techniques involve the formation of shallow trenches in the isolation areas or regions of a semiconductor wafer, which are subsequently filled with dielectric material such as silicon dioxide ($SiO_2$) to provide electrical isolation between devices subsequently formed in the active regions on either side of the filled trenches.

Therefore there remains a need in the art for improved STI processes.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the present invention relates to a method of forming an isolation structure. During this method, an isolation trench is formed within a semiconductor body. After this trench is formed, it is filled by performing multiple high-density plasma depositions to deposit multiple dielectric layers over the semiconductor body. A first of the multiple layers is deposited at a high-frequency power of between approximately 100 watts and approximately 900 watts. This can be scaled to other size wafer processing, for example 300 mm.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
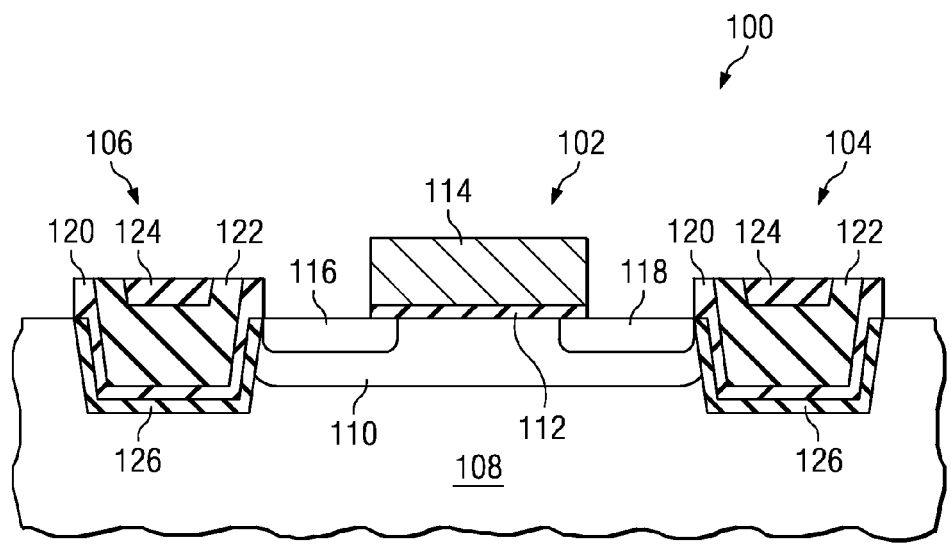
FIG. 1 is a cross-section of a semiconductor device including an STI region.

The present invention will now be described with reference to the attached drawings, wherein like reference numerals are used to refer to like elements throughout. The drawings are not drawn to scale, nor are individual components within the drawings necessarily drawn in scale relative to one another.

As device sizes shrink, it becomes more and more important to prevent and/or deal with wafer defects in a suitable way. One type of defect that the inventors have appreciated is flake type defects, wherein the surface of an incoming wafer has a contaminated or damaged layer that was formed in previous processing steps. This contaminated layer can cause problems, for example, in the formation of shallow trench isolation (STI) regions when the contaminated layer peels off. Because the subsequent "flakes" that peel off are relatively large in comparison to a critical dimension of the devices to be created, the "flakes" significantly degrade yield. In particular, the inventors have discovered that flake defects can be reduced by filling an STI trench via multiple high-density plasma depositions, wherein a first of multiple dielectric layers is deposited at a relatively low high-frequency power.

In order to fully appreciate the various aspects of the present invention, a brief description of one embodiment of a semiconductor device including an STI region will be discussed. In the fabrication of semiconductor devices, isolation structures are formed between active areas in which electrical devices such as transistors, memory cells, or the like, are to be formed. The isolation structures, in this case STI structures, are typically formed during initial processing of a semiconductor substrate, prior to the formation of such electrical devices.

As shown in FIG. 1, a semiconductor device 100 can include an electrical device 102 positioned within STI regions 104, 106, which are recessed into semiconductor body 108 or substrate. Although FIG. 1 shows only a cross-sectional view, it will be appreciated that typically the STI regions 104, 106, surround one or more electrical devices (e.g., metal oxide semiconductor field effect transistor (MOSFET) device 102) much as how a moat surrounds a castle. The illustrated electrical device 102 includes a p-well 110 implanted into the semiconductor body 108, over which a gate oxide 112 and a polysilicon gate 114 are formed. A source 116 and a drain 118 are also implanted into the p-well 110 to allow desired functionality. Although FIG. 1 shows an electrical device that is a MOSFET, it will be appreciated that the present invention extends to other electrical devices such as memory cells and the like.

As shown, STI regions 104, 106 comprise multiple dielectric layers that isolate one group of electrical devices from another (not shown). In the illustrated embodiment, each STI region 104, 106 comprises a first dielectric layer 120, a second dielectric layer 122, and a third dielectric layer 124. Each STI region also comprises an optional oxide liner 126.

In one embodiment, the multiple dielectric layers 120, 122, 124 have densities that differ from one another.

Although various illustrative values have been recited relating to the STI regions 104, 106, it will be appreciated that any value could be inserted in place of these illustrative values. In addition, while three dielectric layers 120, 122, 124 have been shown for purposes of convenience and clarity, it will be appreciated that any number of dielectric layers could be used in accordance with the present invention.

In order to manufacture such a device, STI isolation-techniques are used that allow the formation of shallow trenches in the isolation areas or regions of a semiconductor wafer. One embodiment of a method for manufacturing a STI structure in accordance with aspects of the present invention is illustrated in FIG. 2 and FIGS. 3A-3J. More particularly, the method 200 is described with reference to a flow diagram (FIG. 2) and schematic representations (FIGS. 3A-3J). The illustrated flow diagram (FIG. 2) shows general functional steps, while the schematic representations (FIG. 3A-3J) show various aspects of the STI-structure during the various stages of the method.

While the methods illustrated herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of devices which are illustrated and described herein (e.g., device 100 in FIG. 1) as well as in association with other devices not illustrated, wherein all such implementations are contemplated as falling within the scope of the present invention and the appended claims.

Figure 2:
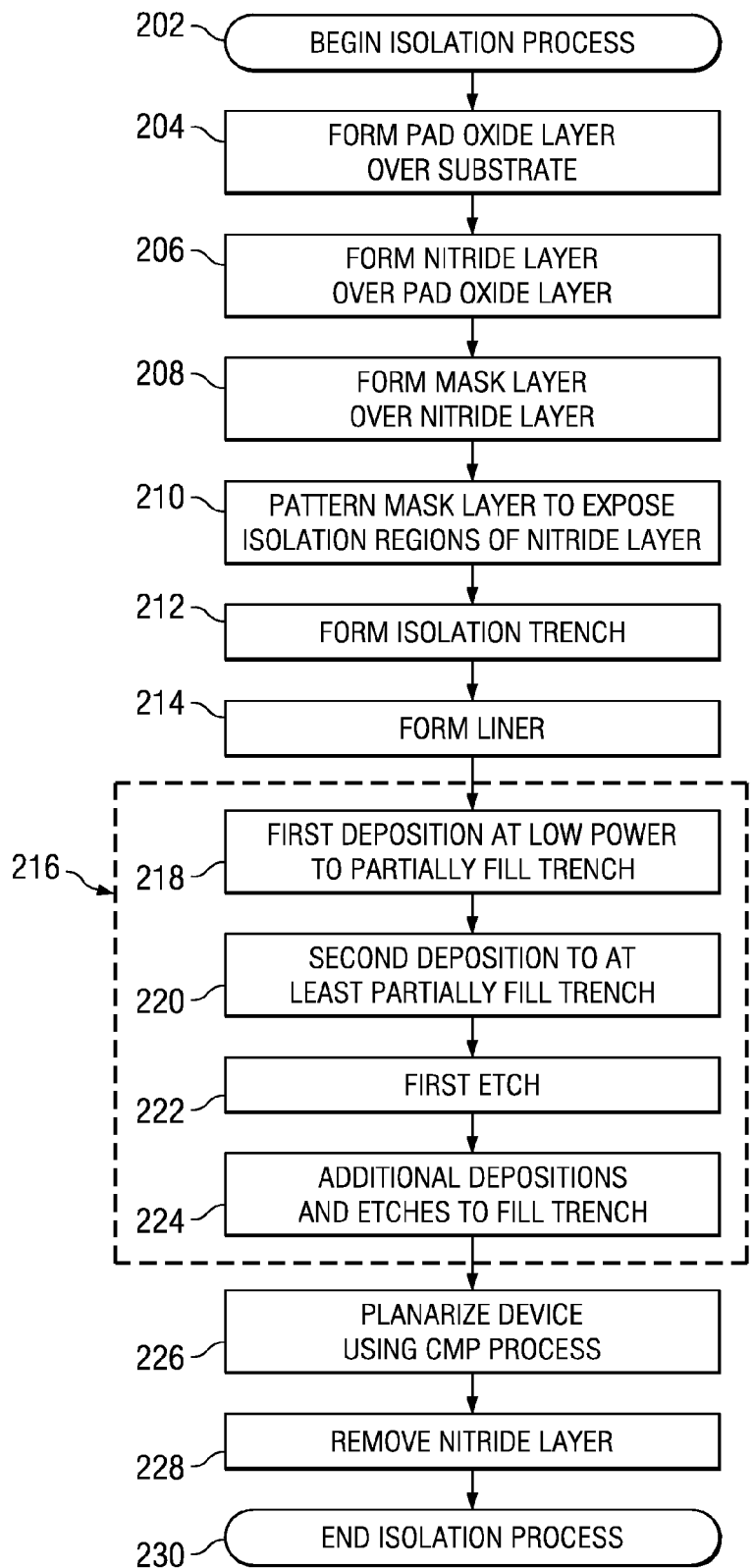
FIG. 2 is a flowchart in accordance with aspects of the present invention.

Referring now to FIG. 2, one can see that the method 200 begins at blocks 204 and 206, when a pad oxide layer and a nitride layer are typically formed over the substrate surface. In block 208, a mask layer is formed over the nitride layer. In block 210, the mask layer is patterned to expose only the isolation regions, with the prospective active device regions covered. The nitride layer operates as a hard mask during subsequent processing steps, and the pad oxide layer functions to relieve stress between the underlying silicon substrate and the nitride layer. In block 212, the isolation trench is formed, typically by performing an anisotropic (e.g., "dry") etch through the nitride, pad oxide, and substrate. Once the trench is etched, an oxide liner may optionally be formed in block 214, after which dielectric material is deposited to fill the trench with oxide in 216. In general, this fill process 216 can comprise multiple depositions and multiple etches. In one embodiment, the first deposition is performed at a low high-frequency power to partially fill the trench in block 218. A second deposition can then be performed in block 220, after which a first etch is performed in block 222. In block 224 additional depositions and etches can be performed to fill the trench. Thereafter, the device is commonly planarized using a chemical mechanical polishing (CMP) process in block 226 and the nitride protection layer is removed in block 228. After the isolation process is complete, transistors, memory cells, and/or other electrical devices (not shown) may be formed in the active regions using semiconductor processing techniques as are known.

A more detailed manufacturing process for manufacturing an STI region 300 is now illustrated and described in FIGS. 3A-3J. At various parts of the description, the process is described with reference to various numerical values that could be used in 200 mm wafer processing. It will be appreciated that other values could be used in this type of wafer processing and that these values could scale with other wafers processing technology, for example, 300 mm wafers.

Figure 3A:
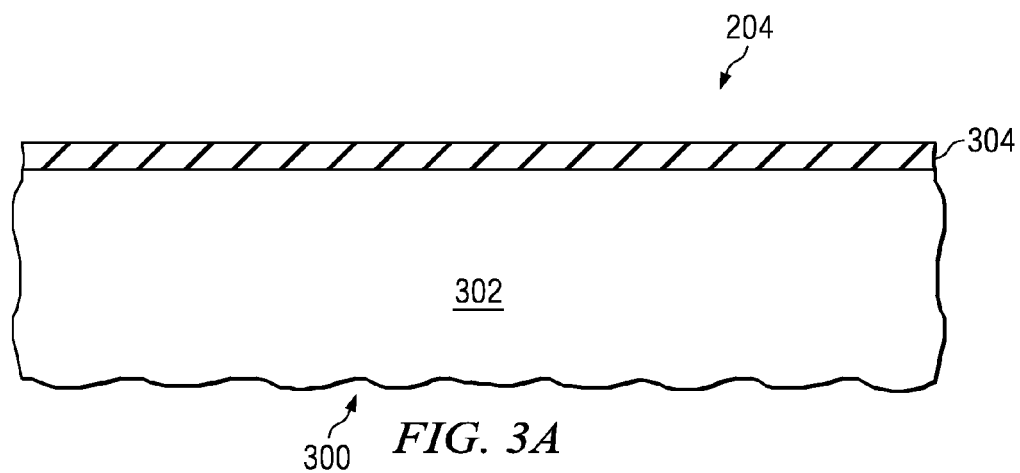
FIGS. 3A-3J are cross-sections of an STI region at various stages in one manufacturing process.
Figure 3B:
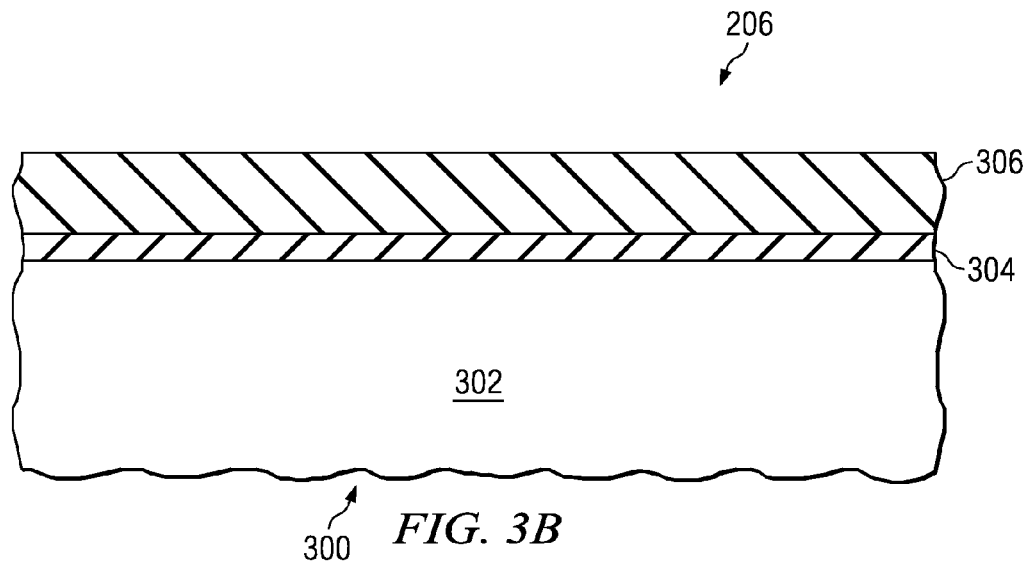

In FIG. 3A, a thermal oxidation process is used to grow a pad oxide layer 304 over a semiconductor body 302. A nitride layer 306, such as $Si_3N_4$, is then deposited in FIG. 3B, such as by low-pressure chemical vapor deposition (LPCVD). The nitride layer 306 is used to protect the active regions of the semiconductor body (e.g., the substrate) 302 from adverse effects of the subsequent formation of isolation trenches between the active regions.

Figure 3C:
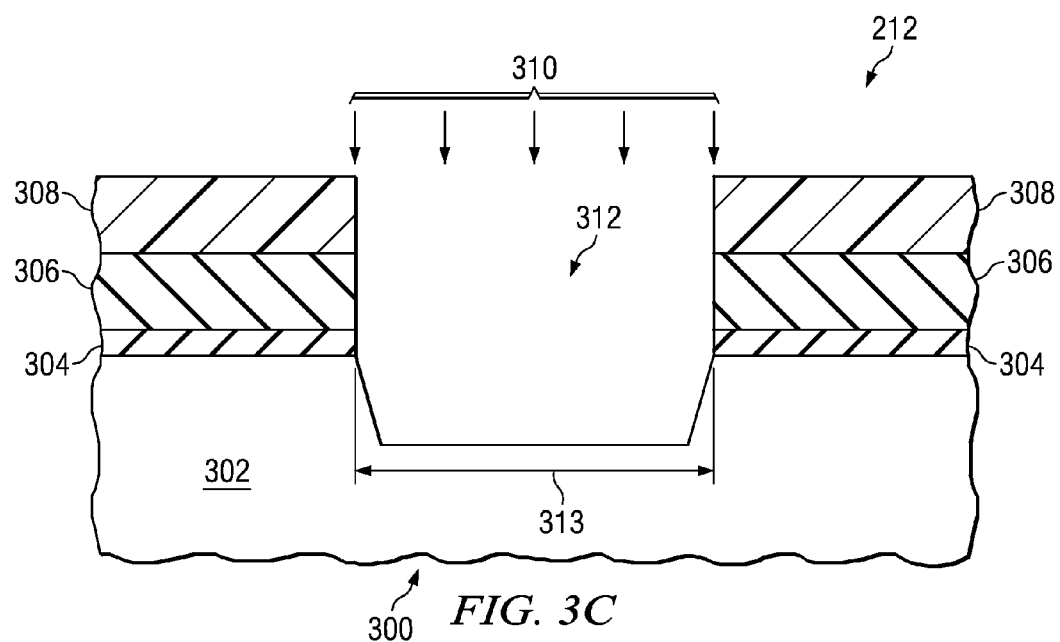

The active regions of the device 112 are then masked in FIG. 3C using a patterned etch mask 308 (e.g., a resist), leaving the isolation region of the nitride layer 306 exposed. A dry etch 310 is performed to form a trench 312 through the nitride layer 306, the pad oxide layer 304, and into the body region 302. In various embodiments the trench 312 will have a width 313 of varying dimensions.

Figure 3D:
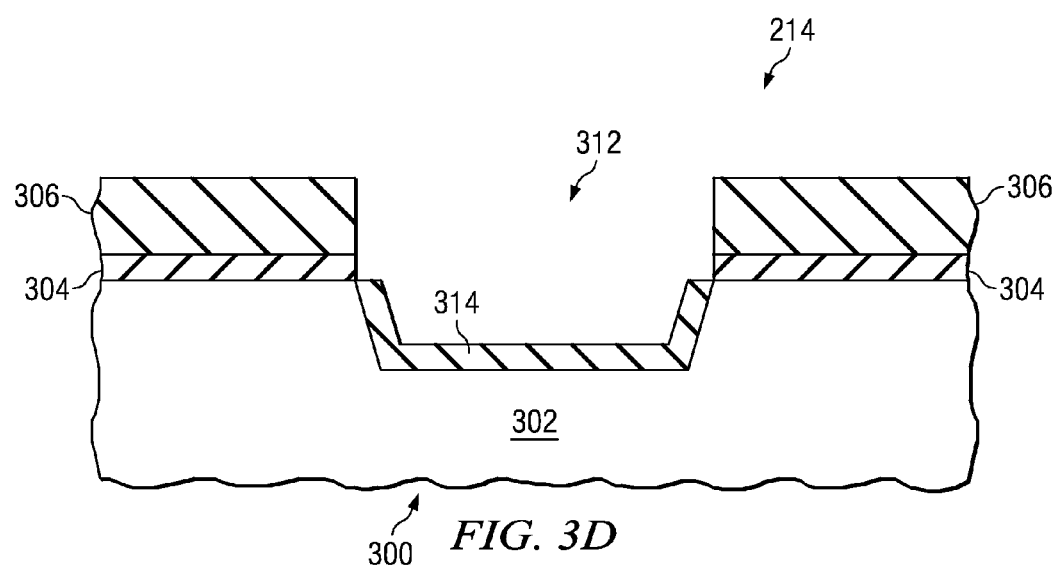

The active mask 308 is then removed in FIG. 3D and an oxide liner 314 is optionally formed in the trench 312 to remove or repair substrate damage caused by the trench etch process 310.

Figure 3E:
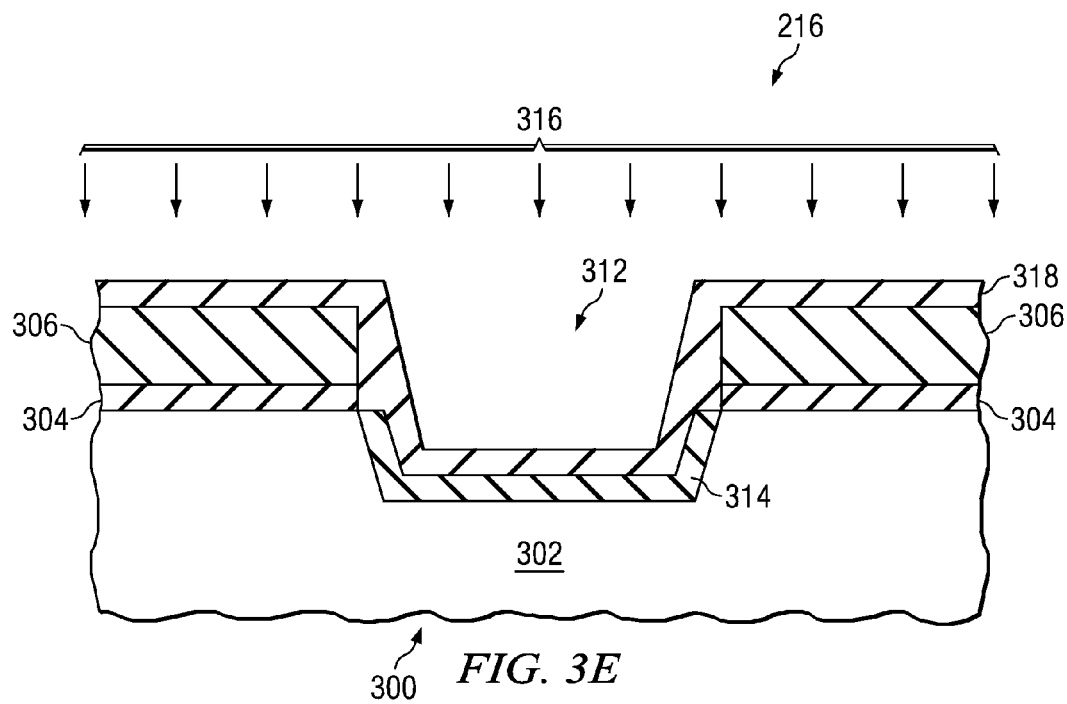

Once the trench 312 and the liner 314 are formed, a first dielectric layer 318 is deposited in FIG. 3E via a first deposition process 316 to partially fill the trench 312 and also to cover the nitride layer 306 in the active regions of the device. In a typical embodiment, the first deposition process is a-high density plasma chemical vapor deposition process.

In one embodiment, this first dielectric layer 318 is deposited at a high-frequency power of between approximately 100 W and approximately 900 W, which creates a high-density plasma, and which may also be referred to as a high-density plasma chemical vapor deposition process. In other embodiments, the high-frequency power could be between approximately 300 W and approximately 800 W, and is approximately 700 W in one embodiment. By depositing the first dielectric layer at a high-frequency power of greater than zero watts, a better fill is achieved than with prior art processes. If the high-frequency bias is too low, a void will start to be present for structures with a high aspect ratio. Further, in various embodiments, the first dielectric layer 318 has a first thickness of between approximately 200 angstroms and approximately 1000 angstroms. In one embodiment, the first thickness is approximately 650 angstroms.

In addition, during the high-density plasma chemical vapor deposition process, a wafer voltage may also be suitably applied to the wafer to vary the extent to which conformal deposition occurs. As the wafer voltage is decreased, the deposition can be said to have a larger chemical component and tends to be more uniform across both horizontal and vertical surfaces. Conversely, as the wafer voltage is increased, the deposition can be said to have a larger physical component and tends to be deposited more quickly in the vertical direction (i.e., more slowly on vertical surfaces).

Figure 3F:
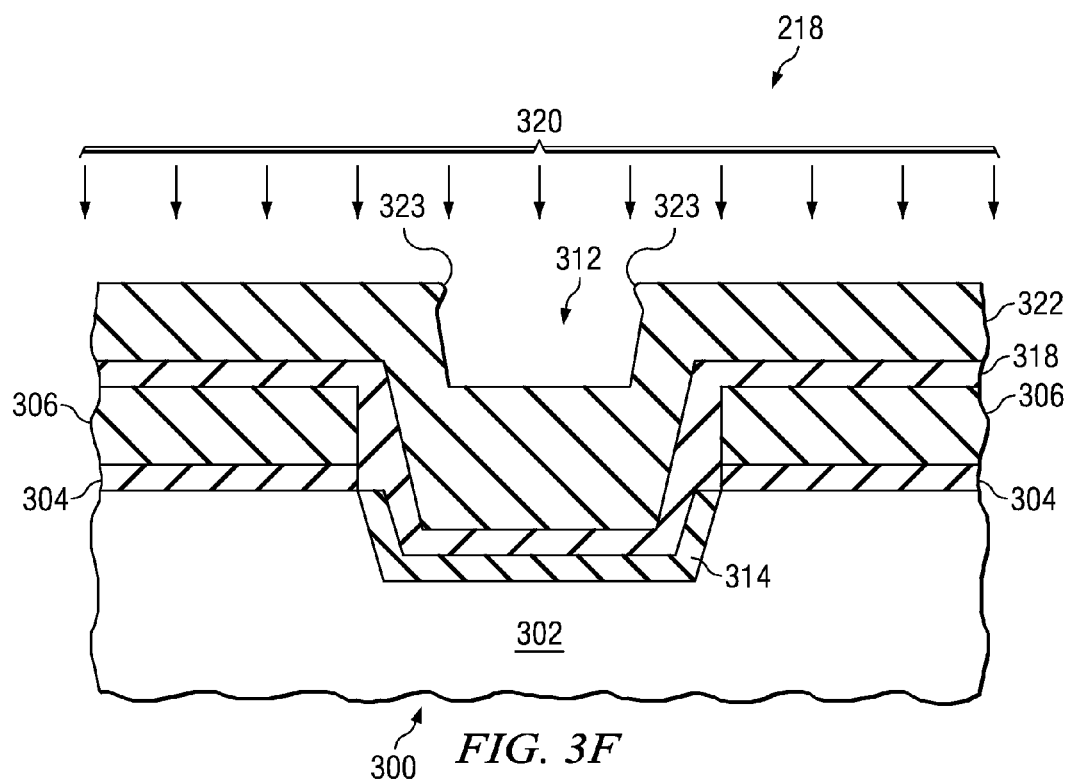

After the first dielectric layer is deposited, a second dielectric layer 322 is deposited in FIG. 3F via a second deposition process 320 to further fill the trench 312 and also to cover first dielectric layer 318.

In one embodiment, this second dielectric layer 322 is deposited at a high-frequency power of between approximately 1000 W and approximately 2000 W. In one embodiment, the high-frequency power could be approximately 1200 W. Further, in various embodiments, the second dielectric layer 322 has a second thickness of between approximately 1000 angstroms and approximately 3000 angstroms. In one embodiment, the second thickness is approximately 1750 angstroms. In a typical embodiment where high-density plasma is used for the second deposition, the thickness and high-frequency power of the second deposition process may be tuned to limit the amount by which the deposited layer "pinches" off over the trench. As shown, in FIG. 3F, as the second deposition proceeds, shoulders 323 may form near the top surface of the second dielectric layer 322.

Figure 3G:
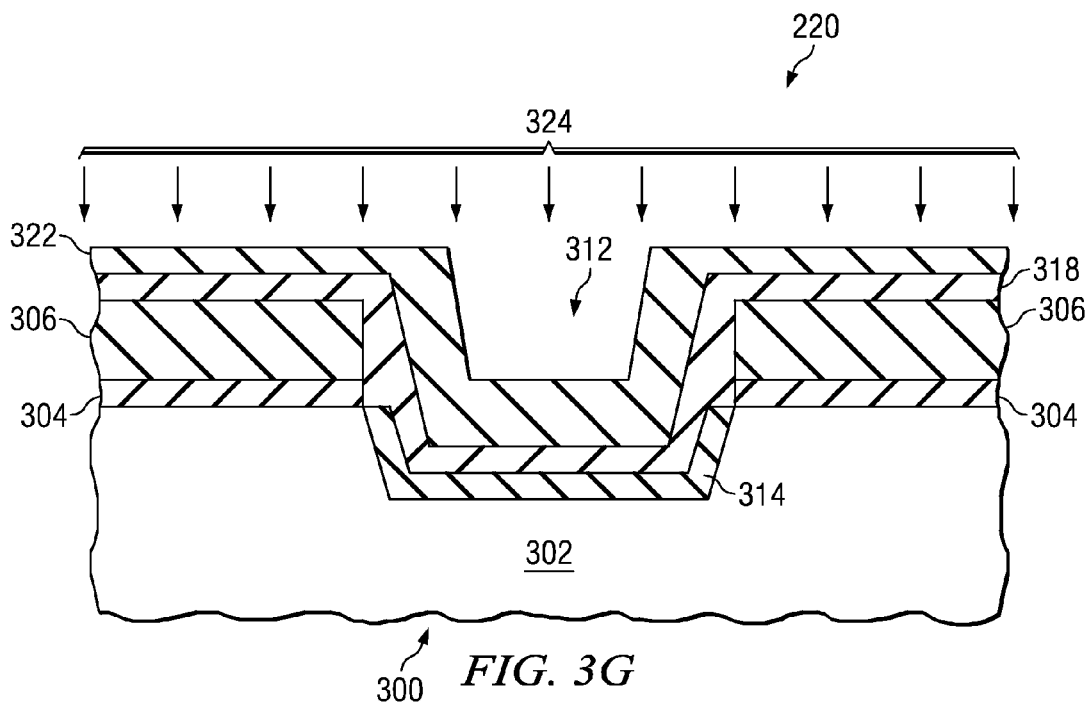

After the second deposition is complete, a first etch process 324 is performed as shown in FIG. 3G. This first etch may, for example, be used to remove the shoulders 323, and open the top of the trench so additional depositions can be made without risk of "pinching" off the top of the trench and forming a gap within the trench. In one embodiment, the first trench may be performed at a high-frequency power of approximately 3000 W and may remove a thickness of approximately 150 angstroms.

Figure 3H:
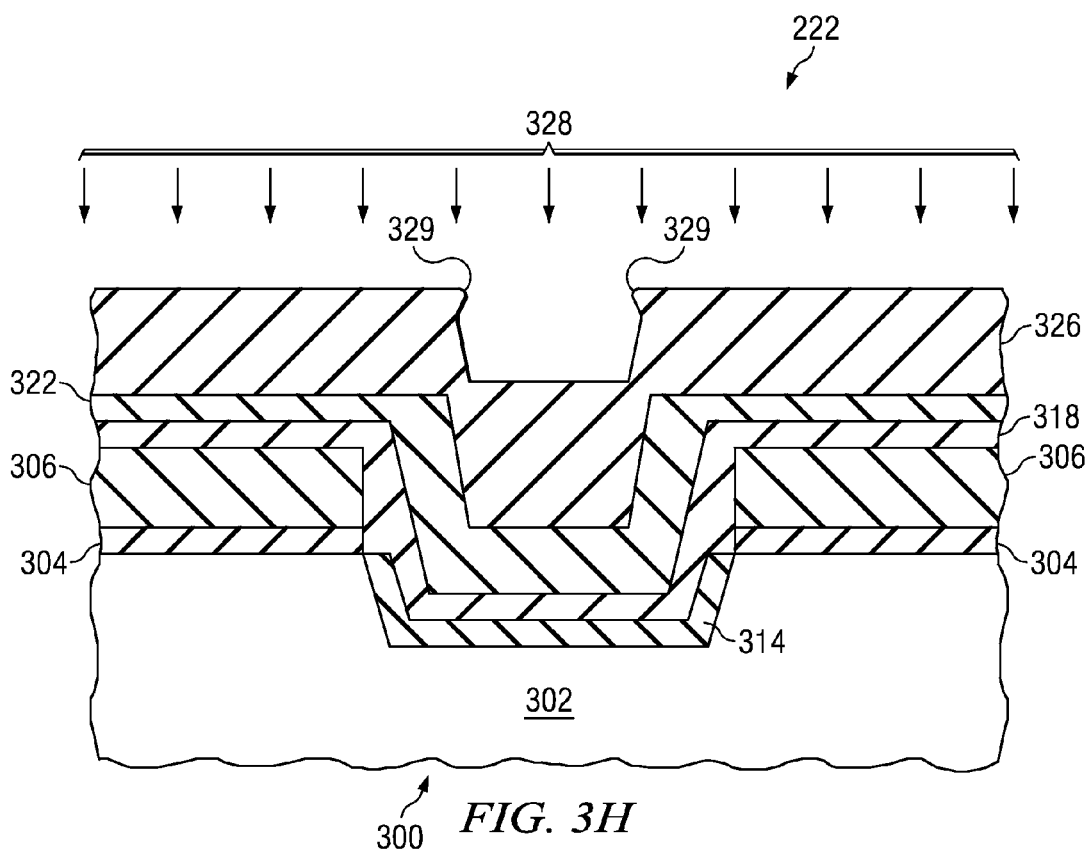

After the first etch is complete, a third dielectric layer 326 is deposited in FIG. 3H via a third deposition process 328 to further fill the trench 312 and also to cover second dielectric layer 322. In one embodiment, this third dielectric layer 326 is deposited at a high-frequency power of between approximately 1000 W and approximately 3000 W. In one embodiment, the high-frequency power could be approximately 2800 W. Further, in various embodiments, the third dielectric layer 326 has a third thickness of between approximately 1000 angstroms and approximately 3000 angstroms. In one embodiment, the third thickness is approximately 1650 angstroms. Again, the third deposition process 328 may cause shoulders 329 to form. Although not shown, additional etches and depositions could be iteratively performed to fill the trench.

Figure 3I:
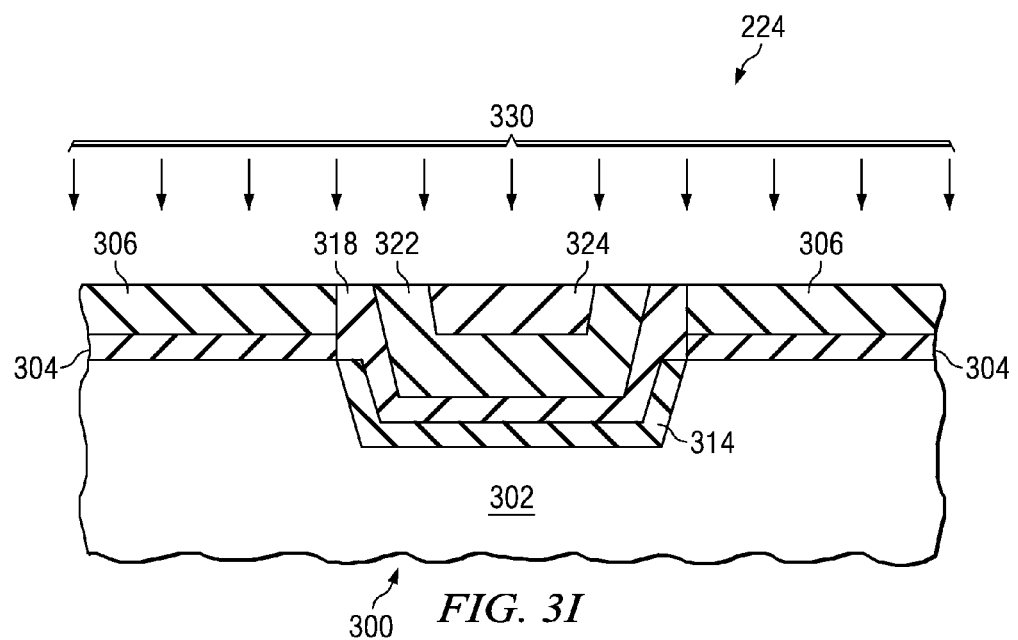
Figure 3J:
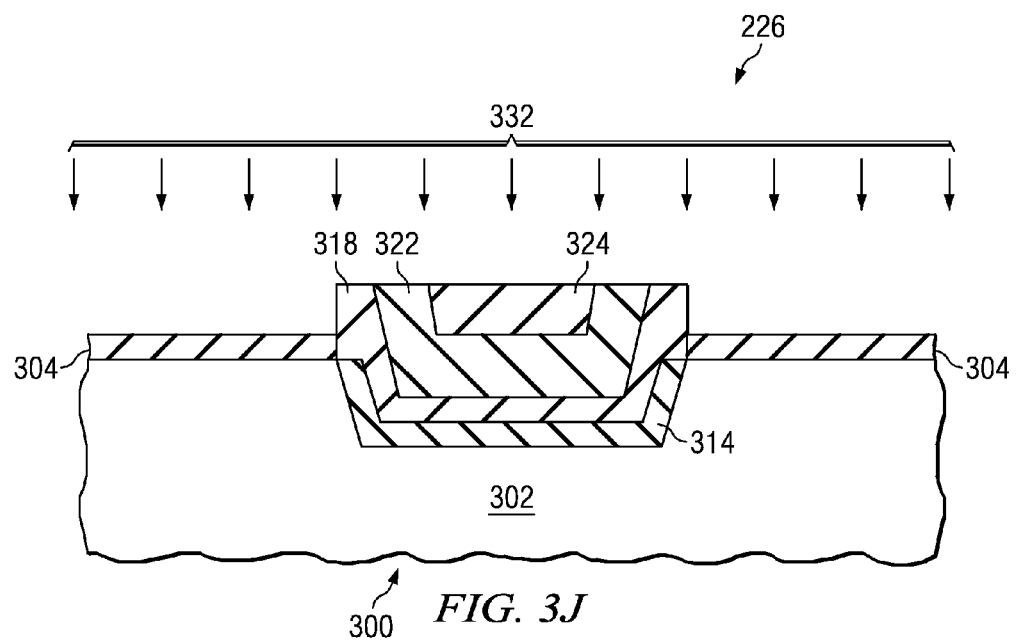

In FIG. 3I, a chemical mechanical polishing (CMP) or other planarization process 330 is used to planarize the upper surface of the device, which exposes the remainder of the nitride layer 306. Following planarization, the nitride layer 306 is removed via an etch process 332 in FIG. 3J to complete the isolation process, leaving the STI structure in the trench 312.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming an isolation structure, comprising:
    forming an isolation trench within a semiconductor body; and
    filling the isolation trench by performing a multiple step high density plasma (HDP) process to deposit multiple layers, wherein the multiple step HDP process comprises:
    performing a first HDP deposition at a first high frequency power of between 100 watts and 900 watts to form a first layer of said multiple layers;
    performing a second HDP deposition, wherein the second HDP deposition uses a second high frequency power greater than said first high frequency power to form a second layer of said multiple layers;
    performing a first etch step after performing said first HDP deposition and said second HDP deposition, wherein the first etch step is the first occurring etch step of the multiple step HDP process; and
    performing a third HDP deposition after performing the first etch step to form a third layer of said multiple layers.

2. The method of claim 1, wherein the first of the multiple layers has a thickness of between approximately 200 angstroms and approximately 1000 angstroms.

3. The method of claim 1, wherein the first etch is performed to remove a shoulder that is formed in a previously deposited dielectric layer during a previous high-density plasma deposition.

4. The method of claim 1, wherein a wafer voltage is concurrently applied to the semiconductor body while the high-frequency power is employed.

5. A method of forming an isolation structure, comprising:
    forming an isolation trench within a semiconductor body; and
    forming a first dielectric layer that partially fills the isolation trench by performing a first high-density plasma deposition at a first high-frequency power of between approximately 100 watts and approximately 900 watts;
    then, without performing an intervening etch step, performing a second high-density plasma deposition to form a second dielectric layer to further fill the isolation trench; and
    performing a third high-density plasma deposition to further fill the isolation trench.

6. The method of claim 5, wherein the first dielectric layer has a first thickness of between approximately 200 angstroms and approximately 1000 angstroms.

7. The method of claim 5, wherein performing the second high-density plasma deposition occurs at a second high-frequency power that is higher than the first high-frequency power.

8. The method of claim 5, wherein the second dielectric layer has a second thickness that is substantially larger than the first thickness.

9. The method of claim 5, wherein the second dielectric layer has a second thickness of between approximately 1000 angstroms and approximately 3000 angstroms.

10. The method of claim 5, further comprising the step of etching the second dielectric layer to form an etched second dielectric layer prior to performing the third high-density plasma deposition.

11. The method of claim 10, further comprising:
    forming additional dielectric layers by performing additional high-density plasma depositions;
    successively etching the additional dielectric layers to remove shoulders formed near the top of the additional dielectric layers during the additional high-density plasma depositions.

12. A method of forming an isolation structure, comprising the following steps performed in order:
    forming an isolation trench within a semiconductor body;
    forming a liner in the isolation trench;
    forming a first dielectric layer over the liner that partially fills the isolation trench by performing a first high-density plasma deposition at a first high-frequency power of between approximately 100 watts and approximately 900 watts;
    performing a second high-density plasma deposition to form a second dielectric layer over the first dielectric layer to further fill the isolation trench at a second high frequency power greater than the first high-frequency power;
    etching the second dielectric; and
    performing a third high-density plasma deposition at a third high-frequency power greater than the first high-frequency power to further fill the isolation trench.

* * * * *